United States Patent [19]

Davies

[11] 4,075,702
[45] Feb. 21, 1978

[54] ELECTRONIC CALCULATING APPARATUS AND WALLET ENCLOSURE

[75] Inventor: David C. Davies, San Jose, Calif.
[73] Assignee: National Semiconductor Corporation, Santa Clara, Calif.
[21] Appl. No.: 666,362
[22] Filed: Mar. 12, 1976
[51] Int. Cl.² .................................................. G06F 15/02
[52] U.S. Cl. ..................................... 364/705; 364/708
[58] Field of Search ........... 235/152, 156, 168, 145 R; 200/5 A

[56] References Cited

U.S. PATENT DOCUMENTS

| | | | |
|---|---|---|---|
| 3,911,234 | 10/1975 | Kotaka | 200/5 A |
| 3,920,979 | 11/1975 | Kilby et al. | 235/168 |
| 3,937,939 | 2/1976 | Frenkel | 235/145 R X |
| 3,940,758 | 2/1976 | Margolin | 200/5 A X |
| 4,002,892 | 1/1977 | Zielinski | 235/156 |

OTHER PUBLICATIONS

*Electronics*, Apr. 3, 1975, pp. 40-41.

*Primary Examiner*—Jerry Smith
*Attorney, Agent, or Firm*—Gail W. Woodward; Willis E. Higgins

[57] ABSTRACT

Several embodiments of an electronic calculating apparatus and wallet enclosure are described. The apparatus is provided with a side-located battery compartment for providing, in combination with the enclosure, a very convenient and useful, relatively thin assembly. The enclosure comprises two flap members. A first one of the flap members is adapted for supporting the apparatus. The other is adapted for folding over in facing relationship with the first. In each of the embodiments the first flap member is provided with an interior wall member. In one embodiment, the apparatus is separably inserted and supported in a pocket formed by the interior wall member. Keys which extend from the face of the apparatus for inserting numbers and the like project through keyholes provided in the interior wall member. In another embodiment, the apparatus is provided with engaging members which extend outwardly from the ends thereof. The members are provided for engaging corresponding slots in the interior wall member and supporting the apparatus from the exterior side thereof. In still another, and even more compact, embodiment, the first flap member is made a part of an electrical circuit in the calculating apparatus in that the interior wall member comprises a deformable substrate for supporting one of two switch contacts in each of a plurality of switch means in the apparatus. The covering flap member in each of the embodiments may also be used for conveniently holding note paper, credit cards, blank checks, or the like.

16 Claims, 17 Drawing Figures

U.S. Patent  Feb. 21, 1978  Sheet 1 of 3  4,075,702
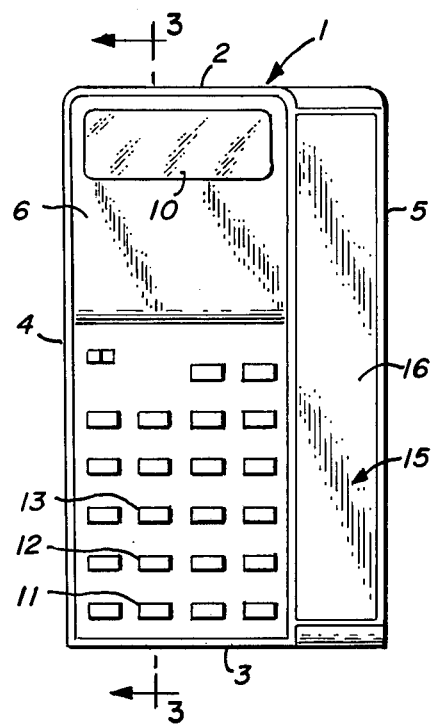
Fig_1
Fig_2
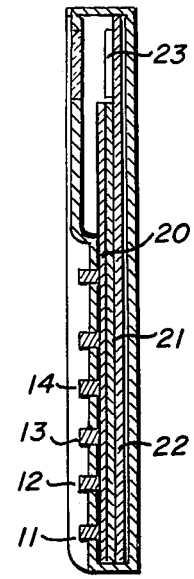
Fig_3
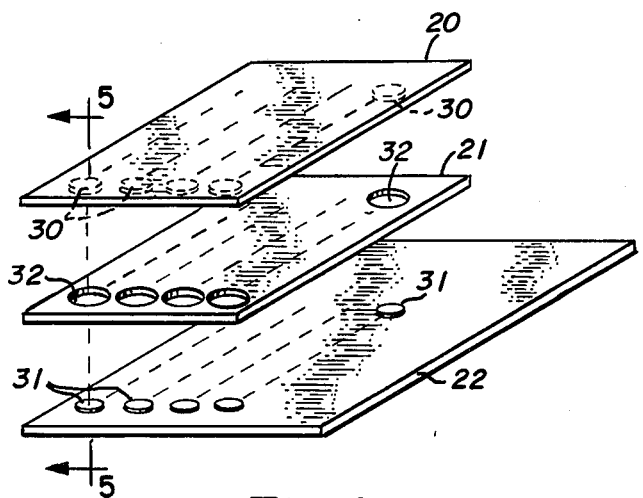
Fig_4
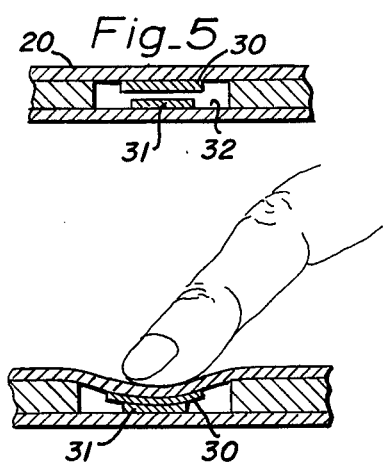
Fig_5
Fig_6

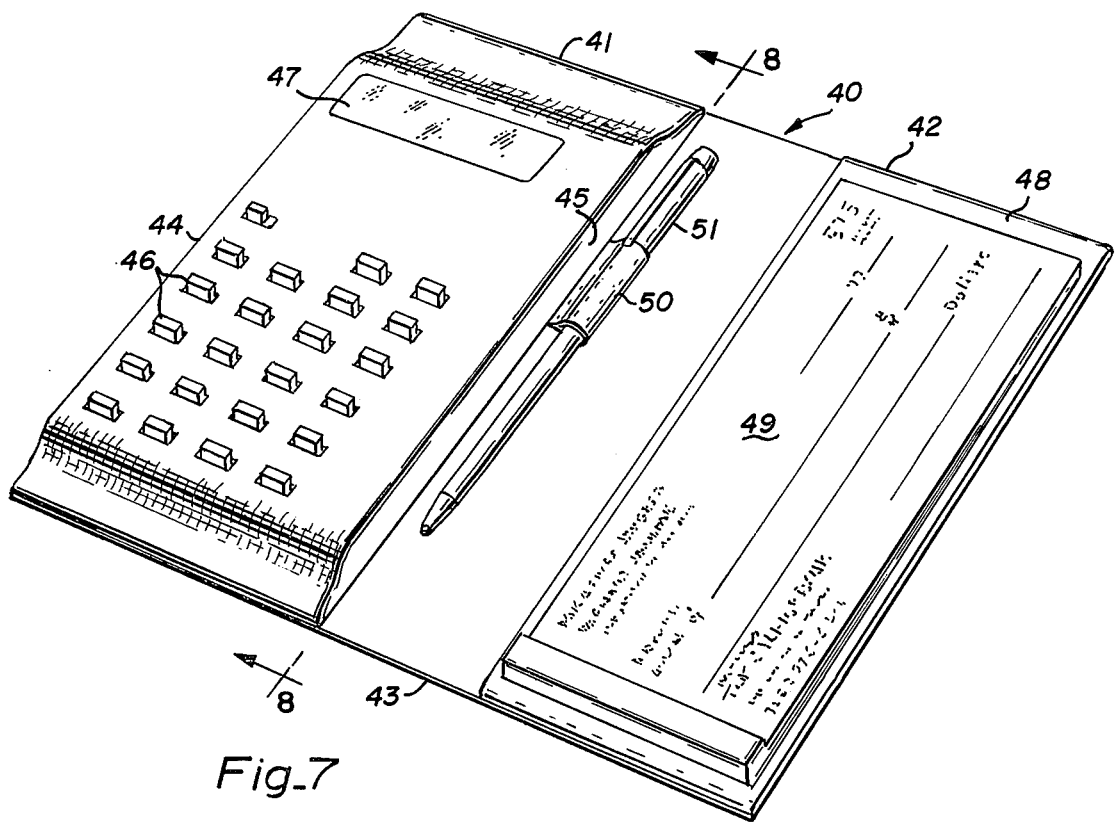
Fig_7
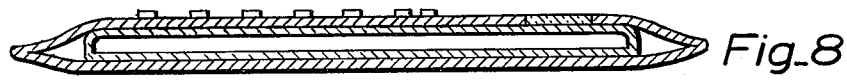
Fig_8
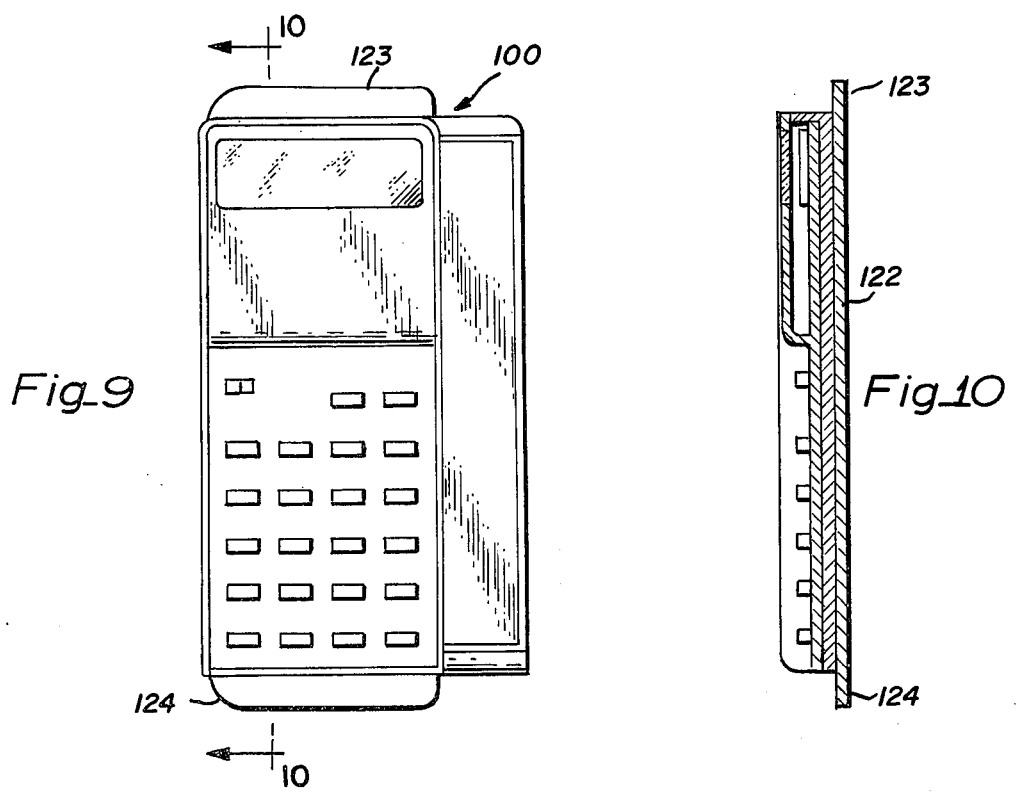
Fig_9        Fig_10

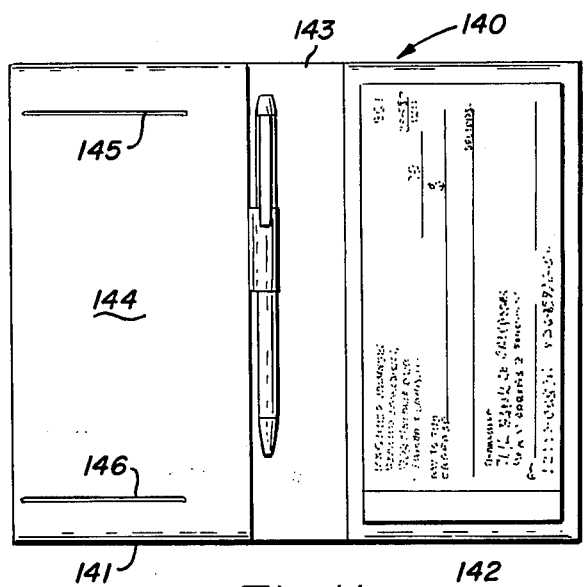
Fig_11
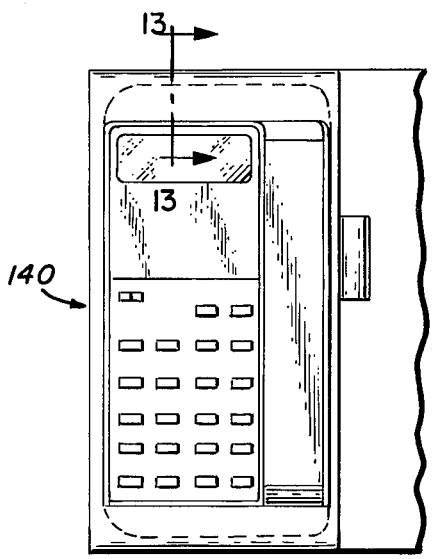
Fig_12
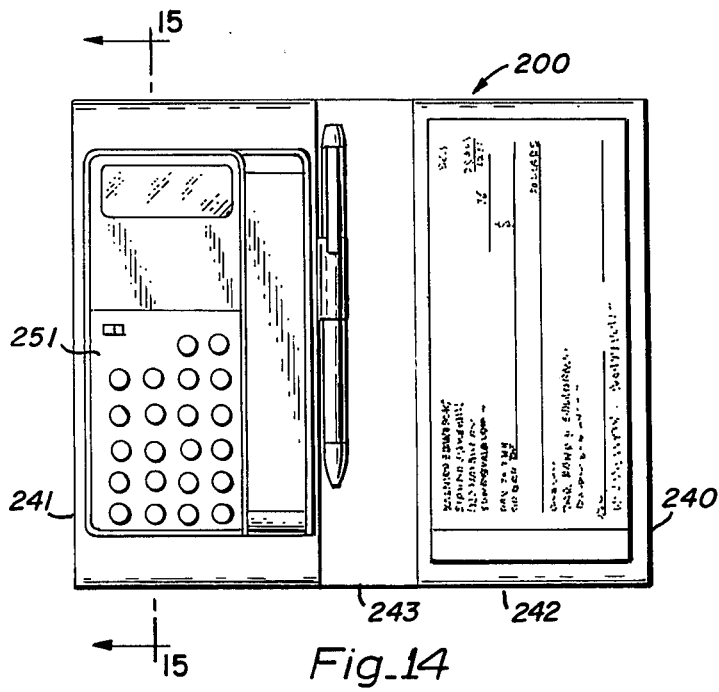
Fig_14
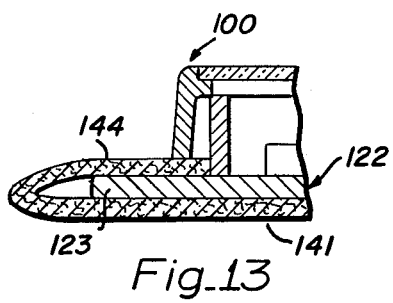
Fig_13
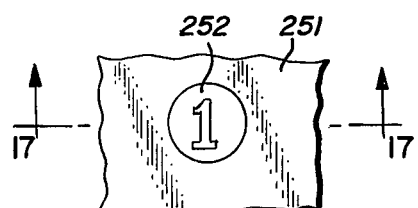
Fig_16
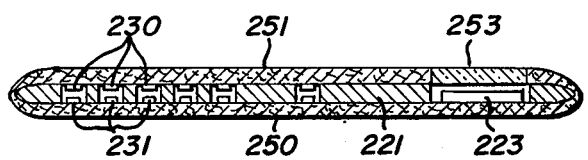
Fig_15
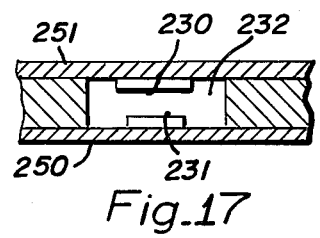
Fig_17

ELECTRONIC CALCULATING APPARATUS AND WALLET ENCLOSURE

BACKGROUND OF THE INVENTION

The present invention relates to electronic calculators in general and in particular to a hand-held battery-powered calculator and wallet-like enclosure.

Conventional calculators of the type to which the present invention is related typically comprise a front panel with a plurality of key-operated switch means for inserting numbers and display means including a window for displaying the results of insertions and computations made therein. The electronic means for performing and displaying the calculations is generally encased in a plastic enclosure. An additional case or bag-like container may also be provided for carrying the calculator, for serving as a dust cover and for preventing damage to the key-operated switch means and the display window which forms an integral part of the front panel. Without the additional carrying case the front panel, keys and window display of a conventional calculator can be more easily damaged. With the carrying case, however, there is present the task of storing the case while using the calculator. Similarly, there is always the chance at this time of misplacing or losing the case. In general, a separable carrying case, while considered useful, is often found to be inconvenient and bothersome.

Another often troublesome feature of many conventional calculators as regards the convenience of carrying a calculator on one's person is their size in general and their thickness in particular. In general the thickness of the calculators, heretofore, has been dictated by the size and location of the batteries used for supplying power. The typical battery means used is 9 volts. Its typical location is a compartment at one of the ends of the calculator. These locations have been dictated generally by the size of the batteries. With conventional, presently available, batteries and an end-located battery compartment, the size and thickness of a conventional calculator tends to restrict the way in which it can be carried on one's person. In many cases, however, it is desirable if the calculator can be carried conveniently in the breast pocket of a man's suit or a woman's purse.

Another feature of known conventional calculators is that they typically do not incorporate as an integral part thereof a case or enclosure suitable for supporting the calculator which also provides a convenient place for storing note paper, blank checks, credit cards or the like.

SUMMARY OF THE INVENTION

In view of the foregoing, a principal object of the present invention is a novel battery-powered hand-held electronic calculator.

A further object is a calculator with a side-located battery compartment for holding batteries.

A further object is a calculator as described above with an enclosure having a pair of foldable flap members in which one of said flap members is adapted for supporting the electronic components of the calculator and the other flap member is adapted for folding over in facing relationship with the first.

Still another object is an enclosure as described above in which the facing flap member is adapted for carrying a note pad, blank checks, credit cards, or the like.

Still another object is a calculator and enclosure as described above in which the flap member for supporting the electronic components forms a part of the electronic components.

By means of the present invention, there is provided an electronic calculator in a wallet-like enclosure. The overall thickness of the calculator and enclosure in combination is kept at a minimum. This is accomplished by lengthening the battery and reducing its thickness by side-locating the battery compartment and a thinner, longer battery held therein and, in one of the embodiments, by incorporating the enclosure as a part of the electronics in the calculator.

DESCRIPTION OF THE DRAWINGS

The foregoing and other objects, features and advantages of the present invention will be apparent from the following detailed description of preferred embodiments and accompanying drawings in which:

FIG. 1 is a plan view of a calculator according to the present invention.

FIG. 2 is a side view of FIG. 1.

FIG. 3 is a cross-sectional view taken along lines 3—3 of FIG. 1.

FIG. 4 is a perspective representative view of printed circuit sheets within the calculator of FIG. 1.

FIG. 5 is a partial cross-sectional view taken along lines 5—5 of FIG. 4.

FIG. 6 is another view of the members shown in FIG. 5 in which one is being deformed to "make" an electrical contact.

FIG. 7 is a perspective view of a calculator and enclosure according to the present invention.

FIG. 8 is a cross-sectional view taken in the direction of lines 8—8 of FIG. 7.

FIG. 9 is a plan view of another embodiment of a calculator according to the present invention.

FIG. 10 is a cross-sectional view taken along lines 10—10 of FIG. 9.

FIG. 11 is a plan view of another embodiment of an enclosure according to the present invention.

FIG. 12 is a plan view of the calculator of FIG. 9 and enclosure of FIG. 11 in combination.

FIG. 13 is a partial enlarged cross-sectional view taken along lines 13—13 of FIG. 12.

FIG. 14 is a plan view of another embodiment of the present invention in which the calculator and enclosure are integral parts of each other.

FIG. 15 is a cross-sectional view taken along lines 15—15 of FIG. 14.

FIG. 16 is a plan view of one of the switch pads of the apparatus.

FIG. 17 is a cross-sectional view taken along lines 17—17 of FIG. 16.

DETAILED DESCRIPTION

Referring to FIGS. 1 and 3, there is provided, in accordance with an embodiment of the present invention, a hand-held, portable electronic calculator designated generally as 1. For convenience, calculator 1 is considered as having a top end 2, a bottom end 3, a left side 4, a right side 5, a front panel or face 6 and back panel or rear 7.

Near the top of face 6, there is provided a window 10. Window 10 is generally transparent to optical radiation from light-emitting diodes, or the like, which are a part of the calculator display circuitry (not shown) behind the window. It is understood, however, that other means may be used for displaying the results of calculations and that appropriate changes may then be required with respect to the window 10.

Beneath the window 10, there is provided a plurality of switch members 11, 12, 13 . . . etc. Switch members 11-13 are provided for inserting numbers in the calculator and for adding, subtracting, etc., the numbers. Some of the switch members may also be used for other types of control functions such as, turning the power on and off and setting constants, etc. The specific number and function of the switch members may vary from machine to machine. Also, one or more of the switch members may be constructed in a different, but well known fashion, depending on whether it is a push-button type (e.g., number) or a sliding type (e.g., on/off switch). Since the details of the key members are only involved incidentally in the present invention, only the push-button type will be described in more detail below.

To the right of switch members 11-13 . . . and window 10 and extending along the right side 5 of calculator 1 is a battery compartment 15. Compartment 15 is fitted with a removable cover 16 behind which is provided a conventional battery connector (not shown) for connecting a battery or batteries to the internal electronic components. The specific type of connector is not critical. What is considered important, however, is the fact that by extending the battery elements along one of the sides of the calculator instead of locating them at either end, as is typical in prior known calculators, the battery elements, with their reduction in thickness, provide a corresponding reduction in the overall thickness of the calculator. This was first recognized when a conventional, commercially available 9-volt battery used in a prior known calculator, was disassembled. Upon its disassembly, it was discovered that the battery comprised a plurality of interconnected, but physically separable internal elements or cells. The elements were separated — that is, rearranged — so as to extend along a side of the calculator. With the elements so arranged, the overall thickness of the battery was significantly reduced. The resulting reduction in battery size led then to a reduction in the overall thickness of the calculator.

Referring to FIGS. 3-5, there is provided, as a part of the electronics in the interior of calculator 1, a plurality of relatively thin, flexible printed circuit cards or sheets 20, 21 and 22. Mounted on the top end of sheet 22, beneath window 10, as seen in FIG. 3, is an integrated circuit chip 23. Chip 23 includes the various required electronic solid-state components, and is provided with the optical display elements which are viewed through the window 10. Since chip 23 is only incidentally involved with the features of the present invention, a more detailed description of the chip is believed to be unnecessary.

Referring to FIGS. 4-6, there is provided on the under surface of card 20 a plurality of metallic pad members 30. On card 22, in facing relationship with each of the members 30, there is provided a corresponding number of metallic pad members 31. In card 21, in registration with corresponding pairs of pad members 30 and 31, there is provided a hole or aperture 32. The relative size of the pad members 30 and 31 and holes 32 is such that, when the surface of sheet 20 over a pad member 30 is depressed, as illustrated in FIG. 6, an electrical contact is made between the pad member 30 and the member 31. By means of associated printed circuitry (not shown) on the cards 20 and 22, whenever a pad member 30 is made to contact a member 31, an electrical conducting path is established between selected components of the integrated circuit chip 23 through the pad members 30 and 31. In the embodiment shown in FIGS. 1-6, the depressing of the sheet 20 to make the electrical contact between the pads 30 and 31 is accomplished using the key members 11, 12, 13 . . . The use of a finger, as shown in FIG. 6, instead of the key members 11, 12, 13 . . . to make the contact, will be described below with respect to FIGS. 14-17.

Referring to FIGS. 7 and 8, there is provided a wallet-like enclosure designated generally as 40, having a first flap member 41 and a second flap member 42. Members 41 and 42 are interconnected by a flexible hinging member 43. In the interior of member 41 there is provided an interior wall member 44 which is attached to the member 41 along its exterior edges so as to form an interior pocket 45. In the surface of the wall member 44 there is provided a plurality of keyholes 46. Holes 46 are provided for receiving the key members 11, 12, 13 . . . In the upper portion of wall member 44 there is provided a window hole 47. Attached to the second flap member 42 is a second interior wall member 48. Member 48 is attached to the member 42 along its exterior edges so as to form a second interior pocket (not illustrated). The wall member 48 may be provided with one or more slots for holding a book of blank checks, credit cards, memo pad, or the like 49. For the convenience of the user there is also provided, attached to the member 43, a member 50 for holding a pen or pencil 51.

In use, the calculator 1 is fitted in the pocket 45 so that keys 11, 12, 13 . . . project through the keyholes 46 and the window 10 is placed in registration with the window hole 47. The flap member 42 may then be folded over the key members 11, 12, 13 . . . so as to protect the key members and window 10 of the calculator 1 and form a compact wallet-like enclosure for insertion in the breast pocket of a man's suit or a woman's purse.

Referring to FIGS. 9 and 10, there is provided a calculator 100 in accordance with another embodiment of the present invention. In the interior of calculator 100 there is provided a printed circuit card 122, having an upper extension 123 and a lower extension 124. The extensions 123 and 124 extend, respectively, beyond the upper or top and bottom edges of the calculator 100.

Referring to FIG. 11, there is provided a wallet-like enclosure 140. Enclosure 140 is provided with a pair of flap members 141 and 142 and an intermediate flexible hinge member 143. In the interior of member 141, and attached thereto about its exterior edges, is an interior wall member 144. At the top and the bottom end of wall member 144 there is provided a slot 145 and 146, respectively.

Referring to FIGS. 12-13, the slots 145 and 146 are provided for receiving the extensions 123 and 124, respectively. In order to provide a neat and tight fit between the edges of the calculator 100 and the interior wall 144, when the extensions 123 and 124 are fitted in the slot 145 and 146, the exterior edges of calculator 100 are spaced from the extensions 123 and 124 by an amount corresponding to the thickness of the material making up the interior wall member 144, as shown more clearly in FIG. 13.

It may be noted that in the embodiment of FIGS. 9-13 the printed circuit card 122 serves also as the rear panel portion of the calculator 100. In all other respects the features of the calculator 100 and enclosure 144 are identical or may be made identical to those shown and described above with respect to the enclosure 40 and the calculator 1 of FIGS. 1-8.

Referring to FIGS. 14-17, there is provided still another embodiment of a wallet-like enclosure and calculator in accordance with the present invention, designated generally as 200. As shown in FIGS. 14-17, the combination 200 comprises an enclosure portion 240, having a first flap portion 241 and a second flap portion 242 interconnected by a hinge member 243. The flap member 241 comprises an exterior wall member 250 and an interior wall member 251, as shown in the cross-sectional view, FIG. 15. On the interior wall surface of member 251, at selected locations there is provided a plurality of metallic pad members 230. On the interior wall surface of member 250 there is provided in facing relationship with each of the members 230 a metallic pad member 231. Mounted to an upper portion of the wall member 250 is an integrated circuit chip 223. Chip 223, as shown in FIG. 15, may be identical to the chip 23 of FIG. 3. Between the wall members 250 and 251 there is provided an intermediate sheet 221. Sheet 221 is provided with a plurality of holes 232. Each of the holes 232 is provided to be in registration with a corresponding pair of the pad members 230 and 231.

As illustrated in FIG. 16, there is provided on the exterior surface of wall member 251, above each of the metallic pad members 230, a selected designation such as a number, a plus sign, a minus sign or the like 252. In addition to the pad members 230 and 231, on walls 251 and 250, respectively, there is provided conventional printed circuit members (not shown) which are electrically conductive for interconnecting selected points of the integrated circuit chip 223 when a pad 230 makes a contact with a pad 231, as described above with respect to the embodiment of FIGS. 1-13.

A wide variety of materials may be used for making the wall members 250 and 251. In general, it is preferable that the majority of the material be opaque so as to hide the underlying electrical components. However, there is provided at the upper end of the wall member 251, a portion 253 which is transparent to the optical radiation which is emitted from underlying display components associated with the integrated circuit chip 223.

In use, an operator depresses the wall 251 at the desired designation 252 in the same fashion as when an operator depresses one of the key members 11, 12, 13 .. of calculator 1 of FIG. 1. The depression of the wall surface 251 deforms the wall surface so as to cause an electrical contact between one of the pads 230 and 231. The operation of the embodiments of FIGS. 14-17 are in all other respects identical to the embodiments heretofore described.

Three embodiments of the present invention are described. In the first embodiment a calculating apparatus is fitted in a pocket of one of the flap members of a wallet-like enclosure. In the second embodiment the calculating apparatus is suspended from the surface of the flap member. In the third embodiment the calculating apparatus and one of the flap members are fabricated as an integral unit. The material of the wallet-like enclosure may be made from any of a variety of suitable synthetic and natural materials, it being recognized, of course, that in the embodiment of FIGS. 14-17, the material must be of a type compatible with the technology of printed circuitry since the fabric serves as a substrate for flexible, metallic, electrically-conducting members. While all or a portion of the enclosures of the three embodiments may have one or more parts which are stiff and relatively rigid, depending on the embodiment, they are preferably made of flexible material so as to conform more closely in comfort and convenience to that of a conventional wallet-type enclosure. It is also contemplated, however, that changes in the details and the arrangement of the parts may be made by those skilled in the art without departing from the spirit and scope of the present invention. Accordingly, it is intended that the description provided herein be considered as illustrative only and that the scope of the invention be determined by reference to the claims hereinafter provided.

What is claimed is:

1. In a battery-operated, portable electronic calculating apparatus having means for inserting numbers, computing means, means for displaying the results of insertions and computations, and battery containing means for powering said apparatus, the improvement comprising means forming an elongated battery compartment having a location extending along one side of said apparatus parallel to the longitudinal axis thereof for receiving an elongated battery means to operate said apparatus.

2. An improvement according to claim 1 wherein said compartment comprises a length substantially equal to the length of said apparatus and the overall thickness of said apparatus is less than one inch thick.

3. A method of reducing the overall thickness of a portable, battery-operated, electronic calculating apparatus comprising the steps of:
   making an elongated battery suitable for operating said apparatus; and
   locating said battery for connection to said apparatus in a position extending along one side of said apparatus parallel to the longitudinal axis thereof.

4. In combination, a battery-operated, portable electronic calculating apparatus and enclosure comprising:
   electronic means for performing and displaying the results of calculations, said electronic means including a compartment which extends along one side and parallel to the longitudinal axis thereof for receiving an elongated battery means to operate said electronic means; and
   means including at least two flap members, a first one of said flap members being adapted for supporting said electronic means and a second one of said flap members being adapted for folding over in a facing relationship with said first flap member for forming a wallet-like enclosure.

5. An apparatus and enclosure according to claim 4 wherein said electronic means comprises a front portion, said front portion including means for making entries in said calculating means and a display means for displaying the results of calculations, and wherein said second one of flap members is adapted for folding over and covering said front portion.

6. An apparatus and enclosure according to claim 5 wherein said second flap means comprises means for attaching predetermined items thereto.

7. An apparatus and enclosure according to claim 4 wherein said electronic means comprises a separable assembly; said first one of said flap members comprising an interior and an exterior member forming a pocket therebetween for receiving said separable assembly; said separable assembly comprises a plurality of raised key members and a display means and said interior member comprises a plurality of key holes, each one of which is provided for receiving one of said plurality of keys and a display window hole for providing visual access to said display means when said separable assembly is inserted in said pocket.

8. An apparatus and enclosure according to claim 7 wherein said second one of said flap members is adapted to fold over and cover said plurality of key members and said display means.

9. An apparatus and enclosure according to claim 8 wherein said second one of said flap members comprises means on the interior thereof for attaching a predetermined item thereto.

10. An apparatus and enclosure according to claim 4 wherein said electronic means comprises a separable assembly; said separable assembly includes an attaching member at opposite ends thereof; said first one of said flap members comprises an interior member and a means is provided at opposite ends of said interior member for receiving said attaching members to attach said separable assembly to said first flap member.

11. An apparatus and enclosure according to claim 10 wherein each of said attaching members comprises a relatively stiff planar card-like member and each of said attaching member-receiving means comprises a slot for receiving said card-like member.

12. An apparatus and enclosure according to claim 11 wherein each of said card-like members comprises an extension of a printed circuit card forming a part of said separable assembly.

13. An apparatus and enclosure according to claim 12 wherein said second one of said flap members is adapted to fold over and cover said separable assembly.

14. An apparatus and enclosure according to claim 13 wherein said second one of said flap members comprises means for attaching a predetermined item thereto.

15. A battery-operated, portable, electronic calculator comprising:
means for entering information into said calculator;
means for performing calculations on information entered into said calculator;
means for displaying said information and the results of said calculations; and
means for housing a battery for operating said calculator, said housing means being adapted to receive an elongated battery of reduced thickness and lying along an edge of said calculator outboard of said entering, performing, and displaying means whereby said battery housing means does not increase the thickness of said calculator.

16. The calculator of claim 15 wherein said battery is elongated sufficiently to substantially span the dimension of said housing along which said battery is located.

* * * * *